United States Patent [19]
Yamada

[11] Patent Number: 5,674,599
[45] Date of Patent: Oct. 7, 1997

[54] DEPOSITED MULTI-LAYER DEVICE

[75] Inventor: Katsuyuki Yamada, Mishima, Japan

[73] Assignee: Ricoh Company, Ltd., Tokyo, Japan

[21] Appl. No.: 584,289

[22] Filed: Jan. 11, 1996

Related U.S. Application Data

[63] Continuation of Ser. No. 57,900, May 7, 1993, abandoned.

[30] Foreign Application Priority Data

May 14, 1992 [JP] Japan .................. 4-148124

[51] Int. Cl.⁶ .................................. G02F 1/1343
[52] U.S. Cl. ................... 428/212; 359/58; 428/216; 428/336; 428/408; 428/698; 428/701
[58] Field of Search .................. 428/698, 701, 428/408, 216, 336, 212; 359/580, 58

[56] References Cited

U.S. PATENT DOCUMENTS 5,190,807  3/1993  Kimock et al. ................. 428/216
5,227,196  7/1993  Itoh ................................ 428/698
5,319,479  6/1994  Yamada et al. .

Primary Examiner—Archene Turner
Attorney, Agent, or Firm—Oblon, Spivak, McClelland, Maier & Neustadt, P.C.

[57] ABSTRACT

The present invention provides a deposited multi-layer device with high reliability, which allows to reduce a weight, a production cost, and to avoid a peeling of a film, a crack and a curl of a substrate.

The present invention relates to a deposited multi-layer device formed on a plastic substrate which is coated with a film of a buffer layer being made of an inorganic material on at least one surface of said substrate, wherein a total stress of the buffer layer is not greater than +700 Pa.m and not smaller than −700 Pa.m.

10 Claims, 4 Drawing Sheets

3040 cm$^{-1}$ SP$^2$ CH(arom)
3000 cm$^{-1}$ SP$^2$ CH(olef)
2960 cm$^{-1}$ SP$^3$ CH$_3$ (dsym)
2920 cm$^{-1}$ SP$^3$ CH
2850 cm$^{-1}$ SP$^3$ CH$_2$ (sym)

DEPOSITED MULTI-LAYER DEVICE

This is a Continuation, of application Ser. No. 08/057,900 filed on May 7, 1993, now abandoned.

BACKGROUND OF THE INVENTION

1. Field of the Invention

The present invention relates to a deposited multi-layer device. More particularly, the invention relates to a switching element which is suitable, for .instance, to a flat panel display for office automation equipments, a television apparatus and the like.

2. Description of the Related Art

In a terminal unit for an office automation equipment and a liquid crystal television apparatus, a use of a large area liquid crystal panel has been strongly desired. For this purpose, there has been proposed an active matrix system in which a switch is provided for each of picture element to thereby maintain a necessary voltage, in Japanese Patent Application Laying Open (KOKAI) Nos. 61-260219 & 62-62333.

On the other hand, extensive studies have been made recently for reducing a weight and a cost of a liquid crystal panel. Japanese Patent Application Laying Open (KOKAI) No. 1-47769 discloses a simple matrix liquid crystal panel using a plastic substrate.

However, when a deposited multi-layer switching element is formed on the plastic substrate, a deformation or a curl of the plastic substrate are caused and a laminated film is peeled. Also, in a process for producing the deposited multi-layer switching element, there is a photolithographic step, in which the device together with the plastic substrate is dipped in an aqueous solution of acid, alkali, or water. The acid, the alkali, or the water remains in the plastic, and thereby causes degradation of the device.

When a fine pattern is to be formed in the deposited multi-layer device, shift of a part of the pattern is caused due to an elongation and a shrinkage of the substrate. As a result, it is difficult to simultaneously expose a large area pattern. An anisotropy in an elongation and shrinkage of the substrate makes the patterning more difficult.

Further, when the deposited multi-layer device formed on the plastic substrate is driven in a predetermined manner, the deposited multi-layer device is peeled from the plastic substrate. When the deposited multi-layer device is used as a liquid crystal driving element, the above mentioned peeling problem is aggravated if a driving voltage of a liquid crystal or of a polymer dispersion liquid crystal is high.

In the production of the liquid crystal display device using the plastic film substrate, an aligning processing by a method inherent to the plastic is required. Japanese Patent Publication No. 1-47769 discloses that the aligning processing onto the plastic film substrate can be performed in the same manner as that onto a glass substrate by forming a $SiO_2$ layer on one side of the plastic film substrate.

SUMMARY OF THE INVENTION

It is therefore an object of the present invention to provide a deposited multi-layer device with high reliability, which allows to reduce a weight and a production cost, and to avoid a peeling of a film, a crack and a curl of a substrate.

In order to attain the above mentioned object, the inventors of the present invention have studied a production of a switching element formed on a light and inexpensive plastic substrate, and have made progress in their studies. As a result, it has been found that it is indispensable to form a buffer layer made of an inorganic material such as $SiO_2$, $Si_3N_4$, etc. in order to obtain an adhesiveness and reliability of the plastic substrate and the switching element.

However, even in the case of the plastic substrate on which the buffer layer of the inorganic thin film is formed, the deformation and the curl are also caused. Further, the buffer layer formed on the plastic substrate is peeled when the buffer layer is made thick, or when it is subjected to a post-process. A principal cause of this problem depends mainly on a stress Of the buffer layer.

The stress of the buffer layer is classified into an intrinsic stress and a thermal stress. In the stress, there are a tensile stress (+) making a film surface concave and a compressive stress (−) making the film surface convex. In general, a sputtering method, CVD method, etc. have a tendency to subject the layer to the compressive stress (−), while a wet process by a sol gel, a spin coat, or the like has a tendency to subject the layer to the tensile stress(+). Also, when a buffer layer is formed by a vacuum deposition, using a plastic film for a substrate, it is required to increase a kinetic energy of deposit particles in order to obtain an adhesiveness. The thermal stress generated from this kinetic energy is inevitable, and is difficult to be separated from the intrinsic stress. For this reason, in the present invention, the combined stress of the intrinsic stress with the thermal stress is referred to hereinafter as an internal stress.

The internal stress (σ) resulted from forming the buffer layer on the plastic substrate is represented by the equation (1). A total stress (S) is represented by the equation (2). It has been also found that the elongation and the shrinkage of the substrate are produced with a variation rate represented by the equation (3). These elongation and shrinkage cause the buffer layer to drop off from the plastic substrate, that is, the peeling of the layer.

$$\delta = \frac{3(1-\nu)dl^2}{Eb^2}\sigma \quad (1)$$

(the equation of Stoney-Hoffmann)

$$S = \sigma \cdot d \quad (2)$$

$$\gamma = \frac{2S}{b \cdot E} \quad (3)$$

δ; displacement amount (meter, i.e. m) (see FIG. 7)
E; Young's modulus of the substrate
b; thickness of the substrate
υ; Poisson's ratio
l; length of the substrate (meter, i.e. m)
d; thickness of the thin film (meter, i.e.m)
σ; internal stress of the thin film (Pascal i.e. Pa)
S; total stress (Pa.m)
γ; variation rate of length of the substrate
(NOTE) Total stress (Pa.m)=internal stress(Pa)×thickness of the film (m)

Figure 7:
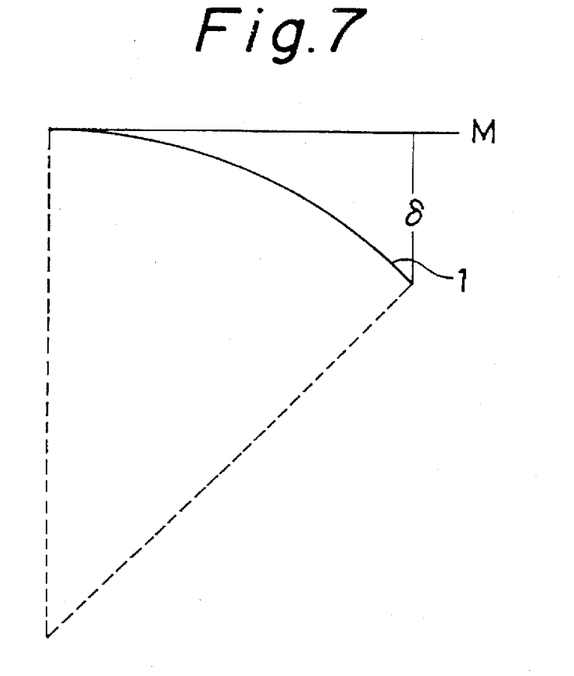
FIG. 7 is an explanatory view for explaining on a displacement δ of a leading edge of the substrate caused by an internal stress.

A displacement amount (δ) of the leading edge of the substrate will be explained with referring to FIG. 7.

The substrate surface prior to formation of the buffer layer thereon is referred to as a reference plane (M). When the buffer layer is formed on this substrate, the internal stress (σ) is produced in the substrate, and the substrate (1) displaces downwardly (or upwardly in some cases) from the reference plane (M) as seen from FIG. 7.

The displacement amount of the leading edge of the substrate (1) at that time is defined by (δ).

As the result of the progress of the study on the peeling of such a buffer layer, it has been found that it is effective to employ an inorganic film having the total stress S in the range of not smaller than −700 Pa.m and of not greater than +700 Pa.m as the buffer layer for the various elements such as the plastic substrate, the switching element, etc. When the stress exists in the deposited multi-layer device, the stress of the deposited multi-layer device is needed to be subtracted from that of the buffer layer. Also, by setting the internal stress of the buffer layer made of an inorganic film in the range from −1000 MPa (compressive stress) to +1000 MPa (tensile stress), it becomes possible to reduce the total stress, and to make the buffer layer thick. Thus, it has been found that above mentioned range of the internal stress is effective to obtain reliability of the deposited multi-layer device. Further, the elongation and the shrinkage of the plastic substrate caused by the stress results in a shift of a fine pattern. Its acceptable range depends on a variable power of an exposure device. With an actual exposure device, the elongation and the shrinkage of 500 ppm is considered as an acceptable limit. In order to treat with the elongation and the shrinkage amount, it is effective to set the total stress of the deposited multi-layer device in the range of not smaller than −300 Pa.m and of not grater than +300 Pa.m, when a preferable plastic substrate is used.

When the deposited multi-layer device is a MIM device using a hard carbon film as an insulation layer, it has been found effective to set the stress of the inorganic thin film of the buffer layer in the range from −400 Pa.m (compressing stress) to +700 Pa.m (tensile stress).

When the deposited multi-layer device is the MIM device using the hard carbon film as the insulating layer, the substrate is elongated by the total stress and the shift of the pattern is sometimes produced. The acceptable range of the shift of the pattern equals to the variable range of an optical system of a stepper, and it has been found also effective to set the total stress of the hard carbon film at not smaller than −300 (Pa.m).

When the deposited multi-layer device is the MIM device using the hard carbon film as the insulating layer, most of the stress of the device constitutes a compressive stress of the hard carbon film. Therefore, when the deposited multi-layer device is the MIM device using the hard carbon film as the insulating layer, it is effective to set the stress of the hard carbon film at not smaller than −300 Pa.m (not greater than 300 Pa.m for the compressive stress).

The stress of the thin film of the buffer layer is easily controlled by a pressure during formation of the film in a dry process. In general, as the pressure is reduced, the internal stress has a tendency to become large. In the case of s formation of the film by a chemical reaction, it is possible to control s composition of the film, thereby enabling also to control the internal stress. The internal stress includes the thermal stress. The thermal stress is influenced by a film formation method. Since a temperature rise is large in the sputtering method, it is useful to form a film intermittently while cooling the substrate. It is useful also to introduce $CH_3$ group into the film to control the internal stress.

In order to produce the deposited multi-layer of the present invention, a plastic substrate such as polyethylene terephthalate (PET), polyethylene naphthalate (PEN), polyimide (PI), polyphenylenesulfide (PPS), polyetheretherketone (PEEK), polyamide (PA), polyethersulfone (PES), polyarylate (Par), polycarbonate (PC), or the like is used. A thickness of the plastic substrate to be used is from 50 μm to 2 mm, preferably not greater than 500 μm, particularly preferably not greater than 300 μm.

For the formation of the thin film consisting of an inorganic material on the plastic substrate, an inorganic material such as $SiO_2$, SiO, SiON, SiO:H, SiN:H, SiON:H, $Si_3N_4$, $TiO_2$, ZnS, ZnO, $Al_2O_3$, AlN, MgO, GeO, $ZrO_2$, $Nb_2O_5$, SiC, $Ta_2O_5$, or the like, or a silicon compound containing a fluorine such as SiO:F, $SiO_2$:F, $SiO_x$:F, $Si_3N_4$:F, SiNx:F, SiON:F, SiC:F, SiOx:CFy, or the like is deposited on one surface or both surfaces of the plastic substrate (plastic film) by the sputtering method, the vapor deposition method, a plasma CVD method or the like to have a thickness thereof from 300 to 15000 Å, preferably from 1000 to 10000 Å at a predetermined stress. In the case of the formation of the thin film on the both surfaces, it is not necessarily required that the inorganic materials for the both surfaces are the same. For example, the inorganic material constituting the first inorganic material layer (FIG. 1, 2a) and the second inorganic material layer (FIG. 1, 2b) may be selected respectively from the group consisting $SiO_2$ and $Si_3N_4$, and the thicknesses of the films are not needed to be the same.

As the most preferable inorganic material, $SiO_2$, $Si_3N_4$, SiON, SiO:H, SiN:H, SiON:H, AlM, $SiO_2$:F, SiON:F, $Si_3N_4$:F and the like are exemplified.

When the inorganic materials used for the both surfaces are the same, that is, the same inorganic materials are used for the first inorganic material layer and the second inorganic material, $SiO_2$, $Si_3N_4$, or SiON is preferable, and $SiO_2$ or $Si_3N_4$ is particularly preferable.

The thin film may be formed by more than tow layers consisting of respective inorganic materials different in its kind, as disclosed in Japanese Patent Application No. 2-417313 filed previously by the applicant of the present invention.

When the deposited multi-layer device is used for a liquid crystal display driving element, a transmissivity of the inorganic material is preferably not less than 75% at a wavelength of from 400 to 850 nm.

In forming the thin films on both surfaces of the plastic substrate, if the thin film is formed on the surface one by one, the substrate is prone to curl just after formation of the thin film on one surface. Also, double labor is required in this method to form a film, thereby causing the problem in productivity and costs. Therefore, it is preferable to form the thin films on the both surfaces simultaneously.

As the deposited multi-layer device, the MIM device comprising metal-insulator-metal layers, a MSI device comprising metal-semi-insulator layers as disclosed in Japanese Patent Application Laying Open (KOKAI) No. 61-275811, a SIS device comprising semiconductor-insulator-semiconductor layers, and a MIMIM device comprising metal-insulator-metal- insulator-metal layers as disclosed in Japanese Patent Application Laying Open (KOKAI) No. 64-7577 can be exemplified. Particularly among them, the MIM device using the hard carbon film as the insulator is preferable.

As a liquid crystal driving MIM device, the MIM device which has the insulating layer consisting of $Ta_2O_5$ or $Al_2O_3$ obtained by anodization of Ta or Al, and the MIM device which has the insulating layer $SiN_x$, a—C:H (hard carbon film) formed by the plasma CVD method are known. Among them, the MIM device which is produced by a process at a temperature not greater than 150° C. and has a large steepness due to the insulating layer made by the hard carbon film is useful.

By the construction of the present invention as described in the above, the deposited multi-layer device with the substrate of the present invention can attain to reduce the deformation, the curl, the elongation and the shrinkage of the substrate, the cost of the fabrication, and the weight of the device.

In particular, the adhesiveness between the plastic substrate and the buffer layer can be obtained in a state as depo.

It becomes possible to make the buffer layer thick, and the adhesiveness between the plastic substrate and the buffer layer can be obtained also in the post-process, thereby enabling to obtain the reliability of the deposited multi-layer device.

When the MIM device which employs the hard carbon film for the insulating film in the deposited multi-layer device is used, the adhesiveness between the plastic substrate, the buffer layer, and the MIM can be obtained.

The shift of the pattern can be reduced to not greater than 500 ppm. Further, when the deposited multi-layer device is made to be a MIM device using a hard carbon film as the insulating layer, a liquid crystal display switching element with a particularly high reliability can be provided, and the switching element is remarkably useful in the industry, since the hard carbon film has characteristics as follows:

(1) the hard carbon film is prepared by a vapor composite method such as a plasma CVD method or the like, so that physical properties can be controlled in a wide range depending on the film-forming condition, and a degree of the freedom to design a device is large;

(2) the hard carbon film can be made hard and thick, so as to prevent from being mechanically injured, and to reduce a number of pin holes due to its large thickness;

(3) the hard carbon film of good quality can be obtained in a low temperature of an approximate room temperature, so that a choice for the material of the substrate is wide;

(4) the thickness and the quality of the hard carbon film is homogeneous, therefore suitable for a thin film device; and (5) the dielectric constant of the hard carbon film is so low that an extremely fine processing technique is not required, therefore advantageous to an enlargement of an area of the device, and the low dielectric constant allows to realize a high steepness, and to obtain a ratio of Ion/Ioff, so that the MIM device can be driven at a duty ratio.

Further objects and advantages of the present invention will be apparent from the following description of the preferred embodiments of the invention as illustrated in the accompanying drawings.

DESCRIPTION OF THE PREFERRED EMBODIMENTS

Figure 1:
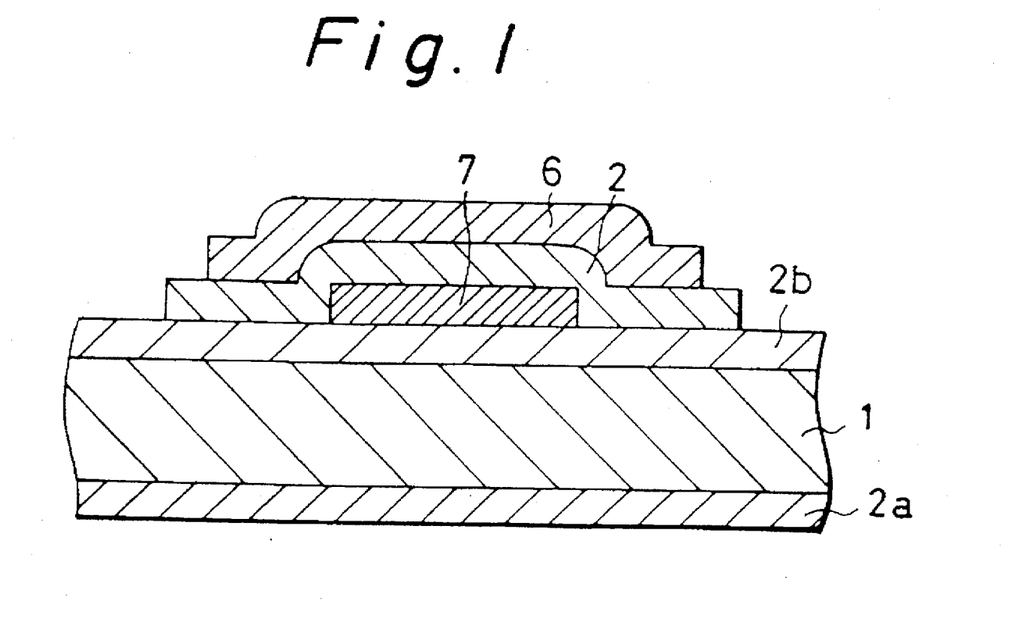
FIG. 1 is a cross-sectional view of a deposited multi-layer device with a substrate of the present invention for showing the structure thereof.
Figure 2:
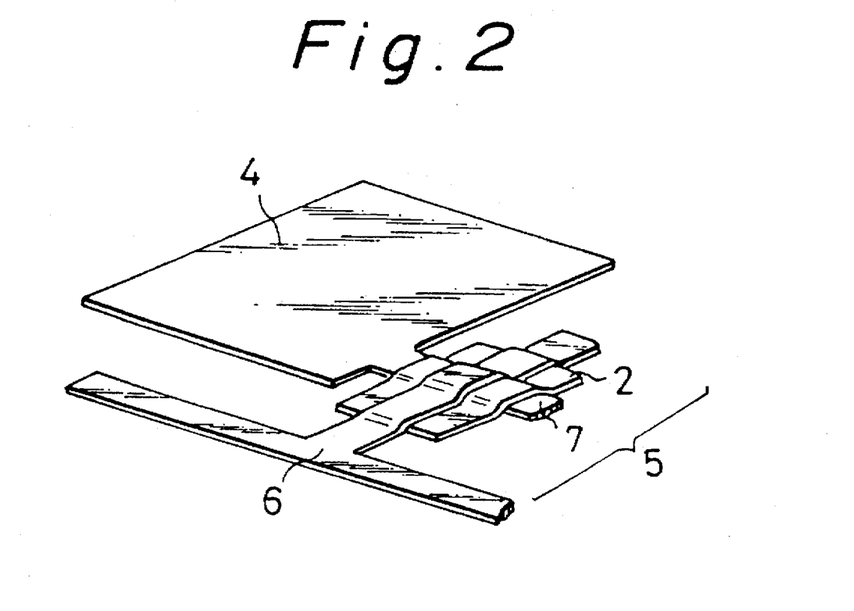
FIG. 2 is an explanatory view for showing a main part of a MIM device constructed by the deposited multi-layer device with a substrate of the present invention.

The method of producing the above mentioned device will be described with referring to FIGS. 1 to 3. At first, a transparent electrode material for a picture element is deposited on one surface or both surfaces 2a, 2b of a plastic substrate 1, which surface(s) is/are coated with the above mentioned inorganic material by a vapor deposition method, a sputtering method, or the like. Then, the surface is patterned into a predetermined pattern, and thus a picture element electrode 4 is obtained.

Then, the conductive thin film is patterned into a predetermined pattern by wet or dry etching to form a first conductor 7 which is to function as a lower electrode. An upper surface of the lower electrode is coated with a hard carbon film 2 by a plasma CVD, an ion beam method or the like. After that, the carbon film 2 is patterned by a dry etching, a wet etching or a lifting off method using a resist, into a predetermined pattern to form an insulting film. An upper surface of the film 2 is further coated with a conductive thin film for bus line by the vapor deposition, the sputtering method or the like, and the conductive film is patterned into a predetermined pattern to form a second conductor 6 which is to function as a bus line. Finally, an unnecessary portion of the lower electrode 7 is removed to expose the transparent electrode having a predetermined pattern, and thus the picture element electrodes 4 is obtained.

However, the constitution of the MIM device is not limited to only the aforementioned embodiment, but various modifications are possible, for example, after the production of the MIM device, the transparent electrode may be finally placed on the uppermost layer, and the transparent electrode may serves simultaneously as the upper electrode or the lower electrode, and the MIM device may be formed on a side face of the lower electrode.

A thicknesses of the lower electrode, upper electrode and the transparent electrode are preferably within a range of several hundreds to several thousands Å, respectively. The thickness of the hard carbon insulating film is preferably within a range of 100 to 8000 Å, more preferably, within a range of 200 to 8000 Å, and further preferably, within a range of 300 to 4000 Å.

In the case of the plastic substrate, up to date it has been difficult to produce an active matrix device using active element due to the heat resistivity. The hard carbon insulating film of good quality can be formed on the substrate even at a room temperature thereof. As a result, the production of the active matrix device on the plastic substrate can be done without trouble, and the image quality is also improved remarkably.

Material constituting a MIM device used in the present invention will be described in detail.

As a material for the first conductor 7 which is a precursor of the lower electrode, various conductive materials such as Al, Ta, Cr, W, Mo, Pt, Ni, Ti, Cu, Au, W, ITO, ZnO:Al, $In_2O_3$, $SnO_2$, etc. can be exemplified.

As a material for the second conductor 6 which is a precursor of the bus line, various conductive materials such as Al, Cr, Ni, Mo, Pt, Ag, Ti, Cu, Au, W, Ta, ITO, ZnO:Al, $In_2O_3$, $SnO_2$, etc. can be exemplified. Among them, Ni, Pt and Ag are preferable since they have excellent stability and reliability in I-V characteristic. In the MIM device using the hard carbon film 2 as the insulating film, a symmetric property thereof does not change even when a kind of the electrode materials is altered. Also Poole-Frenkel conduction is present judging from a relation: $\ln I \propto \sqrt{V}$. From this, any combination of the materials for the upper and lower electrodes can be applied. However, the device characteristics (I–V characteristics) are degradated or varied depending on an adhesion between the hard carbon film and the electrodes or a state of the boundary therebetween. In view of these facts, are preferable as the material of the second conductor 8.

Figure 3A:
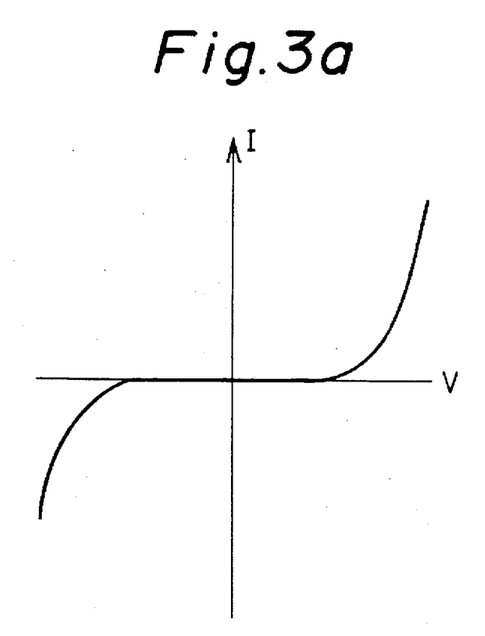
FIG. 3a and FIG. 3b are graphs showing a I-V characteristic curve and a lnI-√V characteristic curve of the MIM device respectively.
Figure 3B:
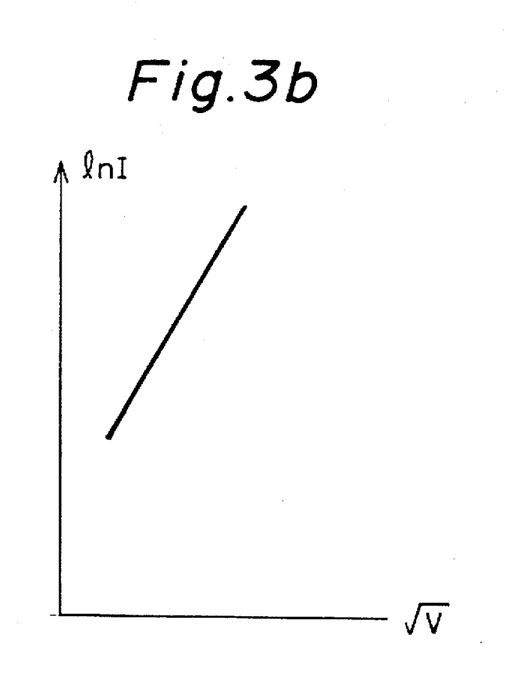

The I–V characteristics of the MIM device according to the present invention are shown in FIGS. 3a and 3b. The characteristics are represented approximately by the following conductive equations (1), (2), and (3):

$$I = \kappa_{exp}(\beta V^{1/2}) \quad (1)$$

$$\kappa = n\mu q / d_{exp}\left(\frac{-\Phi}{kT}\right) \propto \frac{1}{pd} \quad (T = const) \quad (2)$$

$$\beta = \frac{1}{kT}\left(\frac{q^3}{n\epsilon_1\epsilon_2 d}\right)^{1/2} \propto \frac{1}{\sqrt{\epsilon_1 d}} \quad (T = const) \quad (3)$$

wherein:
I: current
V: applied voltage
β: conduction coefficient
n: Pool-Frenkel coefficient
n: carrier density
μ: carrier mobility
q: electron charge amount
Φ: trap depth
ρ: specific resistivity
d: thickness of hard carbon film (A)
k: Boltzman's constant
T: atmospheric temperature
$\epsilon_1$: dielectric constant of hard carbon
$\epsilon_2$: dielectric constant in vacuum The hard carbon film used for the MIM device according to the present invention will be described in detail..

In order to form the hard carbon film, a gas of an organic compound, in particular, a gas of a hydrocarbon is used. A phase state of these starting materials is not necessarily a gaseous phase under a normal temperature and normal pressure.

Any material in a liquid phase or a solid phase is available, if it can be gasified by heating or pressure reduction after passing steps of fusion, evaporation and sublimation.

As the hydrocarbon gas used for a starting gas, all the gas containing at least any hydrocarbons, for example, paraffinic hydrocarbons such as $CH_4$, $C_2H_6$, $C_3H_8$, and $C_4H_{10}$, acetylenic hydrocarbons such as $C_2H_2$, olefinic hydrocarbons, diolefinic hydrocarbons and aromatic hydrocarbons are available.

Other than the hydrocarbons, compounds containing at least carbon element, for example, alcohols, ketones, ethers, esters, CO and $CO_2$, etc. are available as the starting gas.

As a method for forming the hard carbon film from the starting gas in the present invention, it is preferable to use a method in which film-forming active species are formed, after passing through a plasma state, by a plasma process using an electric current such as DC current, low frequency wave, high frequency wave or microwave. However, in order to obtain homogeneous and large area film-formation at a low temperature, it is more preferable to use a method utilizing a magnetic field effect for forming a film under lower pressure. The active species can be formed also by high temperature thermal decomposition. Further, the active species may be formed, after passing through an ionized state, by ionizing vapor deposition or ion beam vapor deposition, or may be formed via neutral particles generated by vapor deposition or sputtering, as well as by a combination of these methods.

The conditions for forming the carbon film are shown below taking a plasma CVD method as an example.

RF output: 0.1 to 50 W/cm$_2$
Pressure: $10^{-3}$ to 10 Torr
Deposition Room temperature to
Temperature: 350° C., preferably room temperature to 250° C.

In this plasma state, the starting gas is decomposed into radicals and ions which react each other at the surface of the substrate. Then, a hard carbon film is formed on the substrate. The hard carbon film includes at least one of an amorphous or a fine crystalline (size of crystals: several tens Å to several μm) both of which essentially contains carbon element and hydrogen element as principal constituent element. The properties of the carbon film are shown in Table 1.

TABLE 1

| Item | Value |
| --- | --- |
| Specific Resistivity (p) | $10^6$–$10^{13}$ ohm · cm |
| Optical Band Gap (Egopt) | 1.0–3.0 eV |
| Hydrogen Amount in the Film [C(H)] | 10–50 atom % |
| SP$^3$/SP$^2$ Ratio | 2/1–4/1 |
| Vickers Hardness (H) | Not higher than 9,500 kg/mm$^2$ |
| Refractive Index (n) | 1.9–2.4 |
| Defect Density | $10^{17}$–$10^{19}$/cm$^3$ |

Measuring methods for the properties shown in Table 1 are shown below.

Specific resistivity (ρ): Determined based on I–V characteristics obtained by a coplanar type cell, Optical band gap (Egopt): Absorption coefficient (α) is determined based on spectral characteristics, and Egopt is calculated by the following equation:

$$(\alpha h\nu)^{1/2} = \beta(h\nu - Egopt)$$

Hydrogen amount of film[C(H)]: Determined by integrating peaks in infrared absorption spectrum near 2900/cm and multiplied with an absorption cross section A, namely, according to the following equation:

$$[C(H)] = A \cdot \int \alpha(\nu)/\nu \cdot d\nu$$

SP$^3$/SP$^2$ ratio: Decomposing infrared absorption spectrum into a Gaussian functions belonging to SP$^3$ and SP$^2$ and determined the ratio based on the area ratio of the functions.

Vickers hardness (H): By the micorvickers meter.
Refractive index (n): With Ellipsometer.
Defect density: According to Electron Spin Resonance.

Figure 4:
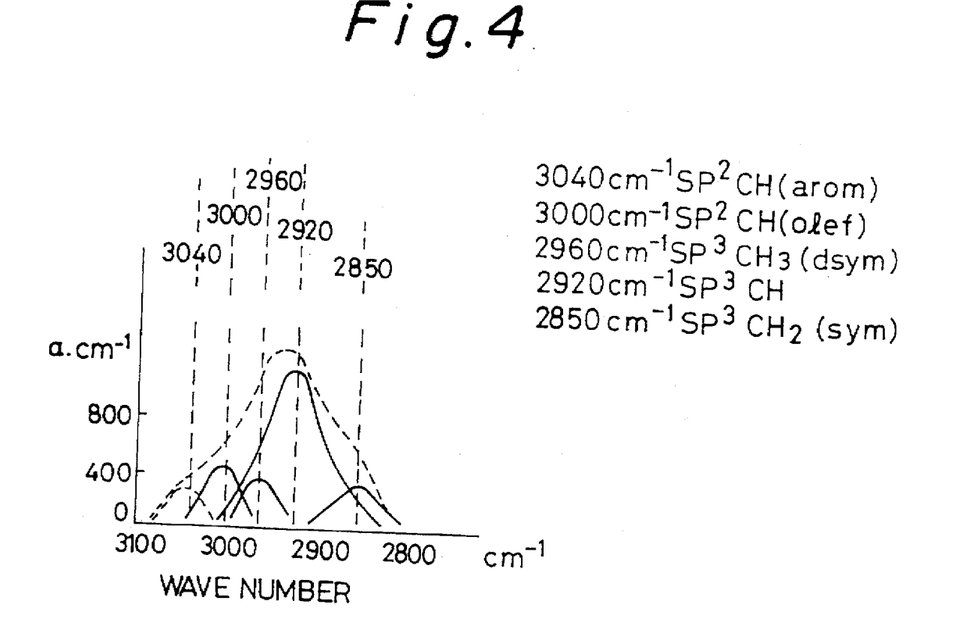
FIG. 4 shows a Gauss distribution of IR spectra of a hard carbon film used for an insulating layer of the MIM device of the present invention.
Figure 5:
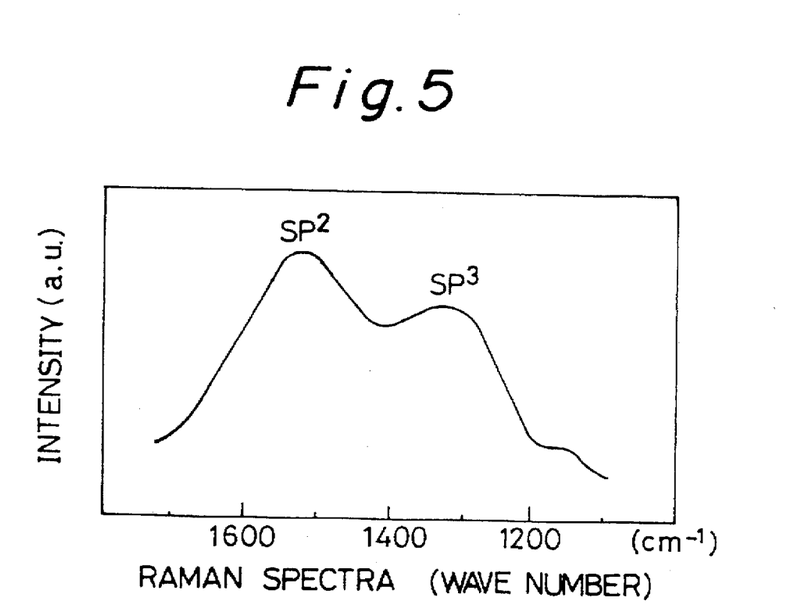
FIG. 5 is a Roman spectra for showing a result of analysis of the hard carbon film used for the insulating layer of the MIM device of the present invention.
Figure 6:
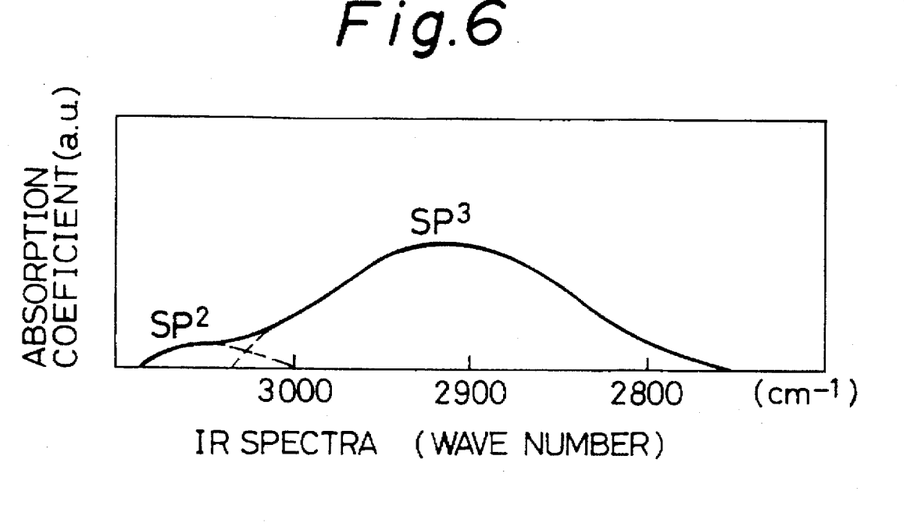
FIG. 6 is a IR spectra for showing a result of analysis of the hard carbon film used for the insulating layer of the MIM device of the present invention.

When thus formed carbon film is analyzed by a Raman spectrometry and an infrared absorption method, as are shown in FIGS. 4,5 & 6, it is apparent that inter-atom bondings of carbon atoms in hybrid orbit for SP$^3$ and hybrid orbit for SP$^2$ are present together. The ratio of SP$^3$ bondings and SP$^2$ bondings can nearly be estimated by separating peaks of IR spectra. That is, in the IR spectra of the film, spectra of various modes from 2800 to 3150 cm$^{-1}$ are superposed and measured, and belonging of peaks to the respective number of waves are apparent and $SP^3/SP^2$ ratio can be determined by separating peaks by the Gaussian distribution as shown in FIG. 4, calculating respective peak areas and determining the ratio thereof.

Further, based on X-ray and electron ray diffractometry, it has been found that the carbon film is in an complete amorphous state (a—C:H) and/or in an amorphous state containing fine crystallites in a size of about 50 Å to several μm.

In the case of formation of the carbon film by a plasma CVD method which is generally suitable for mass production, the processing temperature of the plastic substrate can be lowered and the film having an improved homogeneity for a large area can be obtained, since a specific resistivity and s hardness of the film increase as a RF power is low, and a life of the active species increases as a pressure is low. Further, since the plasma density reduces at a low pressure, it is further effective for an increase of the specific resistivity of the carbon film by utilizing a magnetic field confining effect.

In this method, a hard carbon film of good quality can be formed on the substrate even at s relatively low temperature between a normal temperature and 150° C. This method is optimum for lowering the temperature in the production process for the MIM device. In consequence, since a wide selection of materials for the substrate becomes possible and a control for the temperature of the substrate becomes easy, the method has an advantageous feature for permitting to obtain a carbon film having a large area with homogeneous property. Further, as can be seen from Table 1, the structure and the physical property of the carbon film can be controlled over a wide range. In consequence, the carbon film has an advantage of providing a large freedom for a design of the device features. Further, since the specific dielectric constant of the film is as low as 2 to 6 when compared with $Ta_2O_5$, $Al_2O_3$, and SiNx used for a conventional MIM device, when a device of the same electric capacitance is prepared, the size can be increased- In consequence, fine fabrication is no more necessary and as a result yield of the device is improved. (However, judging from a relation with the driving condition, about 10:1 capacitance between the liquid crystal display and the MIM device is necessary).

A device steepness β is in a following relation:

$$\beta \propto 1/\sqrt{\epsilon} \cdot \sqrt{d}$$

The steepness increases when a dielectric constant ε of the carbon film is small, and therefore a ratio between an ON current $I_{on}$ and an Off current $I_{off}$ is allowed to take a large value. Thus, a liquid crystal display can be driven at a low duty ratio to thereby realize a high density liquid crystal display. Further, since the hardness of the carbon film is high, the film is less injured by the rubbing treatment during sealing of liquid crystal material. This improves the yield of the device. In view of the above, use of the hard carbon insulating film in the MIM device makes it possible to realize a liquid crystal display device having high color gradation and high density at a low cost.

Other than carbon and hydrogen element, the hard carbon film may contain further, as constituent element, element belonging to the groups III, IV and V of the periodical table, to alkali metals, and to alkali earth metals, nitrogen element, oxygen element, chalcogen element or halogen element. When element belonging to the groups III and V of the periodical table, to alkali metals, and to alkali earth metals, nitrogen element, or oxygen element are doped in the film as one of the constituent element, the film thickness can be made twice to three times as compared with a non-doped film. Thereby a generation of pinholes in production of the device can be prevented and a mechanical strength of the device is remarkable improved. An effect by doping nitrogen element, or oxygen element is the same as that by doping element belonging to the group IV of the periodical table.

Further, since a stability and a hardness of the film doped with element belonging to the group IV of the periodical table, chalcogen series, or halogen element are remarkably improved, the device of high reliability can be obtained. This is because, in the case of doping of the group IV element and chalcogen element, active double bonds in the film are reduced, while in the case of doping halogen element, (1) decomposition of the starting gas by hydrogen abstraction reaction is promoted and dangling bonds in the film are reduced, and (2) a hydrogen in the C—H bond is substituted with a halogen element X in the film-forming process and the bonding energy of C—X increases (bonding energy of C—X is greater than that of C—H).

In order to dope the above element belonging to the groups III, IV and V of the periodical table, to alkali metals, and to alkali earth metals, nitrogen element, oxygen element, chalcogen element or halogen element into the film as a constituent element, a gas containing a compound (molecule) having the above element and atom thereof is used in addition to a hydrocarbon gas and hydrogen gas, as a starting gas.

As the compound containing element belonging to the group III of the periodical table, $B(OC_2H_5)_3$, $B_2H_6$, $BCl_3$, $BBr_3$, $BF_3$, Al$(O-i-C_3H_7)_3$, $(CH_3)_3Al$, $(C_2H_5)_3$, Al, $(i-C_4H_9)_3Al$, $AlCl_3$, Ga$(O-i-C_3H_7)_3$, $(CH_3)_3Ga$, $(C_2H_5)_3Ga$, $GaCl_3$, $GaBr_3$, $(O-i-C_3H_7)_3In$, $(C_2H_5)_3In$ can be exemplified.

As the compound containing element belonging to the group IV of the periodical table, $Si_2H_6$, $(C_2H_5)_3SiH$, $SiF_4$, $SiH_2Cl_2$, $SiCl_4$, $Si(OCH_3)_4$, $Si(OC_2H_5)_4$, $Si(OC_3H_7)_4$, $GeCl_4$, $GeH_4$, $Ge(OC_2H_5)_4$, $Ge(C_2H_5)_4$, $(CH_3)_4Sn$, $(C_2H_5)_4Sn$, $SnCl_4$ can be exemplified.

As the compound containing element belonging to the group V of the periodical table, $PH_3$, $PF_3$, $PF_5$, $PCl_2F_3$, $PCl_3$, $PCl_2F$, $PBr_3$, $PO(OCH_3)_3$, $P(C_2H_5)_3$, $POCl_3$, $AsH_3$, $AsCl_3$, $AsBr_3$, $AsF_3$, $AsF_5$, $AsCl_3$, $SbH_3$, $SbF_3$, $SbCl_3$, $Sb(OC_2H_5)_3$ can be exemplified.

As the compound containing alkali metal element, LiO—i—$C_3H_7$, NaO—i—$C_3H_7$, KO—i—$C_3H_7$ can be exemplified.

As the compound containing alkaline earth metal element, $Ca(OC_2H_5)_3$, $Mg(OC_2H_5)_2$, $(C_2H_5)_2Mg$ can be exemplified.

As the compound containing nitrogen element, an inorganic compound such as nitrogen gas and ammonia, an organic compound having a functional group such as an amino group and a cyano group, and a nitrogen-containing heterocyclic compound can be exemplified.

As the compound containing oxygen element, an inorganic compound such as oxygen gas, ozone, water (steam), hydrogen peroxide, carbon monoxide, carbon dioxide, carbon suboxide, nitrogen monoxide, nitrogen dioxide, dinitrogen trioxide, dinitrogen pentoxide, and nitrogen trioxide, and an organic compound having a functional group or bounding such as hydroxyl group, aldehyde group, acyl group, ketone group, nitro group, nitroso group, sulfone group, ether bond, ester bond, peptide bond, and oxygen-containing heterocyclic group and, further, metal alkoxide can be exemplified.

As the compound containing the chalcogenic element, $H_2S$, $(CH_3)$ $(CH_2)_4S(CH_2)_4CH_3$, $CH_2=CHCH_2SCH_2CH=CH_2$, $C_2H_5SC_2H_5$, $C_2H_5SCH_3$, thiophene, $H_2Se$, $(C_2H_5)_2Se$, $H_2Te$ can be exemplified.

As the compound containing halogen element, an inorganic compound such as fluorine, chlorine, bromine, iodine, hydrogen fluoride, carbon fluoride, chlorine fluoride, bromine fluoride, iodine fluoride, hydrogen chloride, bromine chloride, iodine chloride, hydrogen bromide, iodine bromide and hydrogen iodide, and an organic compound such as alkyl halogenide, aryl halogenide, styrene halogenide, polymethylene hologenide and haloform can be exemplified.

As the hard carbon film suitable for the liquid crystal driving MIM device, a film having a thickness from 100 to 8000 Å and a specific resistivity from $10^6$ to $10^{13}$ Ω.cm is preferable in view of driving conditions.

Considering an increase of a difference between a driving voltage and a withstand voltage (insulation breakdown voltage), the film thickness is preferably not smaller than 200 Å. On the other hand, the film thickness is preferably not larger than 6000 Å to control a color unevenness attributable to a level difference between the picture element portion and the thin film two-terminal element section (cell gap difference) not to cause any substantial problem. Therefore, the thickness of the hard carbon film is preferably from 200 to 6000 Å, and the specific resistivity is from $5 \times 10^6$ to $10^{13}$ Ω.cm.

Further, the number of defects in the device caused by the pinholes of the hard carbon film increases with reduction of the thickness of the film, and particularly remarkable when the film thickness is not more than 300 Å and the ratio of defects per device exceeds 1%. Further, a uniformity of the film thickness within a plane which affects the uniformity of the device properties, can not be ensured, since a limit for an accuracy for controlling the film thickness is 30 Å, irregularity of the film thickness can not be reduced to less than 10%, if the film thickness is less than 300 Å. Therefore, it is preferable that the thickness of the carbon film is not smaller than 300 Å.

In order to prevent peeling of the film due to an internal stress of the film and drive the device at a low duty ratio, if possible, less than $\frac{1}{1000}$, the film thickness is preferably not larger than 4000 Å. It is particularly preferable that the thickness of the hard carbon film is 3000 to 4000 Å and specific resistivity is $10^7$ to $10^{11}$ Ω.cm.

EXAMPLE

An example of the present invention will be described hereinafter, but the present invention is not limited to this example.

Tables 2 to 4 show an internal stress (σ), a total stress (S) and a peeling state of a film when various kinds of thin films are formed on various kinds of substrates made of PET, PAr, PPS and PES. Each of stress is derived from the equation (1). Sputter A denotes a sputtering by using $SiO_2$ or $Si_3N_4$ under a reactive pressure $3.0 \times 10^{-3}$ tort, Sputter B denotes a sputtering by using Si under a reactive pressure of $1.0 \times 10^{-2}$, and Sputter C denotes a sputtering by using Si under a reactive pressure $3.0 \times 10^{-3}$. PCVD denotes a plasma CVD under a pressure of 0.035 tort, with a $CH_4$ flow rate of 10 SCCM, at a RF power 0.2 W/cm$^2$.

Sol. gel +P denotes a plasma treating method for a spin coat film of TEOS. "as depot" in the table means a condition just after the formation of the film, and "process" means a condition just after the production of the device.

As clearly shown in the Tables, no peeling of a buffer layer ($SiO_2$, $Si_3N_4$) as depo (without any treatment after formation of the thin film) was confirmed in a region where a total stress is not smaller than −700 Pa.m and not greater than +700 Pa.m. Further, at an internal stress of not smaller than −1000 Mpa and not greater than +1000 Mpa, it became possible to make the film thick, and no peeling was confirmed in "process", so the device was favorable. Samples 12, 13, 14 and 15 show respective conditions of films when the hard carbon film (referred to as DLC in the table) was formed directly on the plastic substrate. Peelings were caused in some plastic substrates as depot, and in MIM production process, all the plastic substrates cause a problem. The MIM device could not be produced without a buffer layer.

Then, a MIM device having the insulating layer made of the hard carbon film (DLC film) produced under the condition of Sample 15 was produced by using the PET substrate (250 μm) on both surfaces of which $SiO_2$ (7000 Å) is deposited under the condition of Sample 4. As a result, the MIM device could be produced with a pattern shift of 200 ppm without any peeling. Further, no characteristic variation was found after the storage of the device for 1000 hours at a temperature of 80° C.

Many widely different embodiments of the present invention may be constructed without departing from the spirit and scope of the present invention. It should be understood that the present invention is not limited to the specific embodiments described in the specification, except as defined in the appended claims.

TABLE 2

| Sample No. | Substrate Material | Thickness μm | Young's modulus kgf/mm$^2$ |
|---|---|---|---|
| 1 | PET | 250 | 400 |
| 2 | PET | 250 | 400 |
| 3 | PET | 250 | 400 |
| 4 | PET | 250 | 400 |
| 5 | PET | 250 | 400 |
| 6 | PET | 250 | 400 |
| 7 | PET | 250 | 400 |
| 8 | PET | 250 | 400 |
| 9 | PET | 250 | 400 |
| 10 | PAr | 100 | 180 |
| 11 | PAr | 100 | 180 |
| 12 | PPS | 75 | 400 |
| 13 | PES | 100 | 220 |
| 14 | PAr | 75 | 180 |
| 15 | PET | 250 | 400 |
| 16 | PAr | 100 | 180 |

TABLE 3

| Sample No. | Production method | Thin film material | Thickness Å | Internal stress MPa | Total stress |
|---|---|---|---|---|---|
| 1 | Sputter A | SiO$_2$ | 2000 | −800 | −160 |
| 2 | Sputter A | SiO$_2$ | 7000 | −820 | −570 |
| 3 | Sputter B | SiO$_2$ | 2000 | −580 | −120 |
| 4 | Sputter B | SiO$_2$ | 7000 | −600 | −420 |
| 5 | Sputter C | SiO$_2$ | 2000 | −1900 | −380 |
| 6 | Sputter C | SiO$_2$ | 4000 | −2000 | −760 |
| 7 | Sputter C | Si$_3$N$_4$ | 2000 | −1500 | −300 |
| 8 | Sputter C | Si$_3$N$_4$ | 5000 | −1500 | −750 |
| 9 | Sputter C | Si$_3$N$_4$ | 6000 | +500 | +300 |
| 10 | Sputter A | SiO$_2$ | 7000 | −160 | −110 |
| 11 | Sputter C | SiO$_2$ | 7000 | −820 | −570 |
| 12 | PCVD | DLC | 1400 | −600 | −80 |
| 13 | PCVD | DLC | 1400 | −500 | −70 |
| 14 | PCVD | DLC | 850 | −600 | −50 |
| 15 | PCVD | DLC | 2800 | −800 | −220 |
| 16 | Sol. Gel + P | SiO$_2$.CH$_3$ | 8000 | +100 | +80 |

TABLE 4

| Sample No. | Peeling of Film | |
|---|---|---|
| | as depo | Process |
| 1 | O K | N G |
| 2 | O K | O K |
| 3 | O K | N G |
| 4 | O K | O K |
| 5 | O K | N G |
| 6 | N G | N G |
| 7 | O K | N G |
| 8 | N G | N G |
| 9 | O K | O K |
| 10 | O K | O K |
| 11 | O K | N G |
| 12 | O K | (N G) |
| 13 | O K | (N G) |
| 14 | O K | (N G) |
| 15 | N G | N G |
| 16 | O K | O K |

(NOTE)
Sputter A:
A sputtering using $SiO_2$ or $Si_3N_4$ under a reactive pressure of $3.0 \times 10^{-3}$ torr
Sputter B:
A sputtering using Si under a reactive pressure of $1.0 \times 10^{-2}$ torr
Sputter C:
A sputtering using Si under a reactive pressure of $3.0 \times 10^{-3}$ torr
+: tensile stress
−: compressive stress

What is claimed is:

1. A thin film device comprising:
   a plastic substrate of thickness not greater than 500 µm;
   a buffer layer of an inorganic material coated at least on one side of the said plastic substrate; and a multi-layer device formed on said buffer layer wherein the total stress of said buffer layer is not greater than +700 Pa.m, and not smaller than −700 Pa.m and the internal stress of said buffer layer is not greater than 1000 MPa and not smaller than −1000 MPa, the buffer layer being from 6,000 Å to 15,000 Å thick.

2. A thin film device according to claim 5, wherein said buffer layer is made of one inorganic material selected from a group consisting of $SiO_2$, $Si_3N_4$, and SiON.

3. A thin film device according to claim 1, wherein said multi-layer device is an MIM device.

4. A thin film device according to claim 3 wherein a hard carbon film is used as an insulating layer of said MIM device.

5. A thin film device according to claim 4, wherein a total stress of said hard carbon film is not greater than +300 Pa.m and not smaller than −300 Pa.m.

6. A thin film device according to claim 4, wherein said hard carbon film includes at least one of an amorphous and a crystallite containing carbon element or hydrogen element as a principal constituent element.

7. A thin film device according to claim 4, wherein said hard carbon film includes an element belonging to the groups III, IV and V of the periodical table, alkali metal element, alkali earth metal element, nitrogen element, oxygen element, chalcogen element or halogen element as constituting element, in addition to the carbon element and hydrogen element.

8. A thin device according to claim 4, wherein said hard carbon film has a resistivity from $10^6$ to $10^{33}$ Ω-cm.

9. A thin film device comprising:
   a plastic substrate of thickness not greater than 500 µm;
   a buffer layer of an inorganic material coated at least on one side of the said plastic substrate; and a multi-layer device formed on said buffer layer, wherein the total stress of said buffer layer is not greater than +700 Pa.m, and not smaller than −700 Pa.m, and the internal stress of said buffer layer is not greater than 1,000 MPa and not smaller than −1,000 Mpa, said buffer layer being made of one inorganic material selected from the group consisting of $SiO_2$, $Si_3N_4$, and SiON and said plastic substrate is formed of a single layer of an organic polymeric plastic, the buffer layer being from 6000 Å to 15000 Å thick.

10. A thin film device according to claim 9 in which the buffer layer is 6,000 Å–10,000 Å thick.

* * * * *